United States Patent [19]
Bae et al.

[11] Patent Number: 5,535,028
[45] Date of Patent: Jul. 9, 1996

[54] LIQUID CRYSTAL DISPLAY PANEL HAVING NONRECTILINEAR DATA LINES

[75] Inventors: Byungseong Bae, Suwon; Kyungseop Kim, Seoul; Wonbong Yoon, Suwon; Seogyul Lee, Seoul, all of Rep. of Korea

[73] Assignee: Samsung Electronics Co., Ltd., Suwon, Rep. of Korea

[21] Appl. No.: 221,962

[22] Filed: Apr. 4, 1994

[30] Foreign Application Priority Data

Apr. 3, 1993 [KR] Rep. of Korea ................. 93-5645

[51] Int. Cl.$^6$ ................................................. G02F 1/1343
[52] U.S. Cl. ........................................... 359/61; 359/59
[58] Field of Search ................................ 359/59, 61

[56] References Cited

U.S. PATENT DOCUMENTS 4,968,119  11/1990  Stewart ............................. 359/59

Primary Examiner—Anita Pellman Gross
Assistant Examiner—James A. Dudek
Attorney, Agent, or Firm—Cushman Darby & Cushman

[57] ABSTRACT

A display panel which ensures an optimum aperture efficiency by efficiently disposing each signal line, switching device and pixel that form the display panel. Gate lines and inclined portions of data lines are respectively utilized as gate electrodes and source electrodes, and a hexagonal honey-comb-shaped structure may be used as the basic shape of pixels. Each drain electrode pattern of the switching devices has an inclined side equivalent to inclined portions of the data lines to increase the aperture efficiency and on-currents.

14 Claims, 5 Drawing Sheets

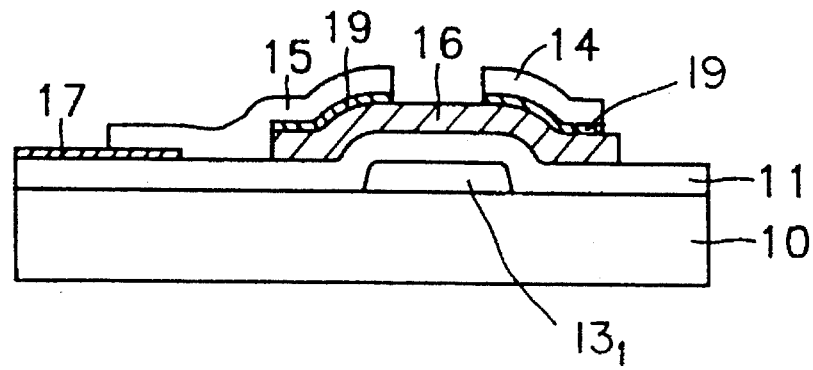
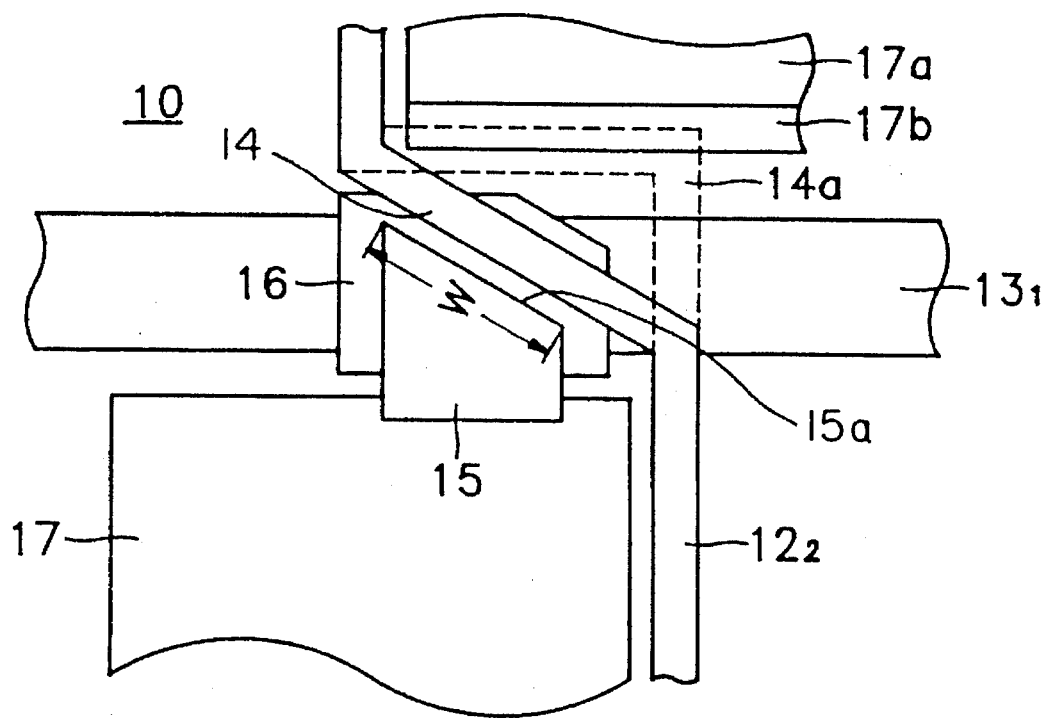

LIQUID CRYSTAL DISPLAY PANEL HAVING NONRECTILINEAR DATA LINES

BACKGROUND OF THE INVENTION (1) Field of the Invention

The present invention relates to liquid crystal display panels in which a thin film transistor is used as an active element, and more particularly to a display panel which ensures the enhancement of aperture efficiency and pixel driving capability by efficient design and arrangement of the structural element of the display panel, e.g. data lines, gate lines, thin film transistors, and pixels.

(2) Description of the Related Art

In the field of image processing for information transmission, many image display devices have been developed. In particular, various flat panel display devices have taken the place of conventional cathode ray tubes.

Techniques for making liquid crystal displays which are small in size, light in weight, and have low voltage driving performance and low electric power-consumption have improved. In particular, active matrix type liquid crystal display devices have been made by blending manufacturing techniques for liquid crystal displays and semiconductor devices. Such a method enhances display quality by providing non-linear switching devices to each pixel arranged in a matrix. These switching devices may be made of thin film transistors of amorphous silicon.

In order to improve the quality of liquid crystal display panels, data lines, gate lines, switching devices and electrodes should be designed such that improvements in switching devices, aperture efficiency and processing space are possible.

There has been proposed a panel in which thin film transistors are formed directly on gate lines in order to increase the aperture efficiency, that is, to maximize the size in pixels of the aperture for allowing light to pass. This conventional delta shape display panel is shown in FIG. 5 and has been manufactured by SHARP Electronics Corporation.

As shown in FIG. 5, gate lines $53_n$ (n=1, 2, ..., n) and data lines $52_n$ (n=1, 2 ..., n) are arranged in a matrix, and thin film transistors are disposed directly on the gate lines $53_n$ adjacent to each intersection of the gate lines and data lines. The gate lines serve as gate electrodes. Drain electrodes 55 are connected to liquid crystal cells through source electrodes 54 and pixel electrodes 57.

Data lines $52_n$ are formed to be level with and perpendicular to gate lines $53_n$ so that electrodes of thin film transistors may be suitably formed on gate lines $53_n$, i.e., so that device formation regions and pixel electrodes 57 are secured.

Source electrodes 54 are formed integrally with data lines $52_n$, and drain electrodes 55 are spaced from source electrodes 54. Semiconductor layers 56 and insulating layers (not shown) are formed between the device formation regions of gate lines $53_n$, and source and drain electrodes 54 and 55.

Such a display panel increases the area of the pixel electrodes 57 by disposing the device formation regions directly on gate lines $53_n$. However, optimum aperture efficiency is not ensured because regions of data lines $52_n$ including the source electrodes 54, encroach on the regions of the pixel electrodes 57.

The source and drain electrodes 54 and 55 are wired on the device formation regions, and signals may be transmitted from a source electrode 54 to a drain electrode 55 via channel layers 56, which are semiconductor layers. The width of channel layers 56 is limited by the source and drain electrodes 54, 55 and depends on the shape of the electrode pattern.

The channel width can be improved so as to satisfactorily supply on-currents to pixel electrodes requiring a larger driving current. However, the increase in the width of the gate electrodes is closely related to the width of the gate lines $53_n$. Also, increased gate electrode width is not desirable in view of the size of the display device, and because off-currents are increased at the same time.

Also, since the devices arranged in a matrix are formed directly on the strip-shaped gate lines $53_n$, the gate lines $53_n$ require a large width so that the channel width, source and drain electrodes 54, 55 may be formed without misalignment.

SUMMARY OF THE INVENTION

It is an object of the present invention to provide a display panel having optimum aperture efficiency by arranging data lines and gate lines effectively.

It is another object of the present invention to provide a high performance display panel by increasing the channel width of switching devices.

In order to achieve the above objects, a first preferred embodiment of the present invention provides for a liquid crystal display panel in which semiconductor patterns are spaced apart from the gate lines formed on the glass substrate by inserting an insulating layer over the gate lines, and data lines are formed so as to cross the gate lines on the semiconductor patterns. The gate lines and data lines intersect at an oblique angle. Drain electrode patterns are formed which are spaced apart from the data lines at the intersections of the gate lines and data lines and have one side parallel to the data lines. Pixel electrodes are connected to the drain electrode patterns, and thin film transistors are formed on the intersection points of the gate lines and data lines.

According to a second preferred embodiment of the present invention, a liquid crystal display panel is provided in which gate lines and data lines are formed on a glass substrate and intersect each other so as to form a matrix. The data lines overlap, and are parallel to, a part of the gate lines at the intersection points of the gate lines and data lines. Drain electrode patterns are formed spaced apart from the data lines on the intersections of the data lines and gate lines and have one side parallel to the data lines. Semiconductor patterns are formed between the gate lines, data lines and drain electrode patterns on the intersections. Pixel electrodes are connected to the drain electrode patterns, and switching devices are formed on the intersection points.

According to a third preferred embodiment of the present invention, a liquid crystal display panel is provided in which the gate lines each have a plurality of hexagonal edge shapes, and the upper portions of adjacent hexagonal edges are sequentially connected. Data lines intersect the gate lines at the connection points of the hexagonal edges. Switching devices are formed adjacent to each intersection of the gate lines and data lines, and pixel electrodes are connected to the drain electrodes of the respective switching devices and are inside spaces defined by the hexagonal edges.

The present invention ensures an optimal aperture efficiency by efficiently disposing the signal lines, switching devices and pixels that form the display panel. Specifically, the gate lines and inclined portions of the data lines are used as gate electrodes and source electrodes, and the pixels are formed in a hexagonal honey-comb-shaped structure. Channel width portions of each switching device are provided with a slanted side to increase the aperture efficiency and on-currents. That is to say, the increase of the channel width due to the slanted portions of the data lines allows an increase of the on-currents. The slanted portions of the data lines of this invention also enhance aperture efficiency, since the area occupied by the transparent electrodes is larger than that of the conventional transparent electrodes.

BRIEF DESCRIPTION OF THE DRAWINGS

The present invention will be better understood upon review of the following detailed description of the preferred embodiments in conjunction with the accompanying drawings, in which:

FIG. 2A is a sectional view taken along line A–A' of FIG. 1;

FIG. 2B is a plan view showing an enlarged pixel of FIG. 1;

DETAILED DESCRIPTION OF THE PREFERRED EMBODIMENTS

Figure 1:
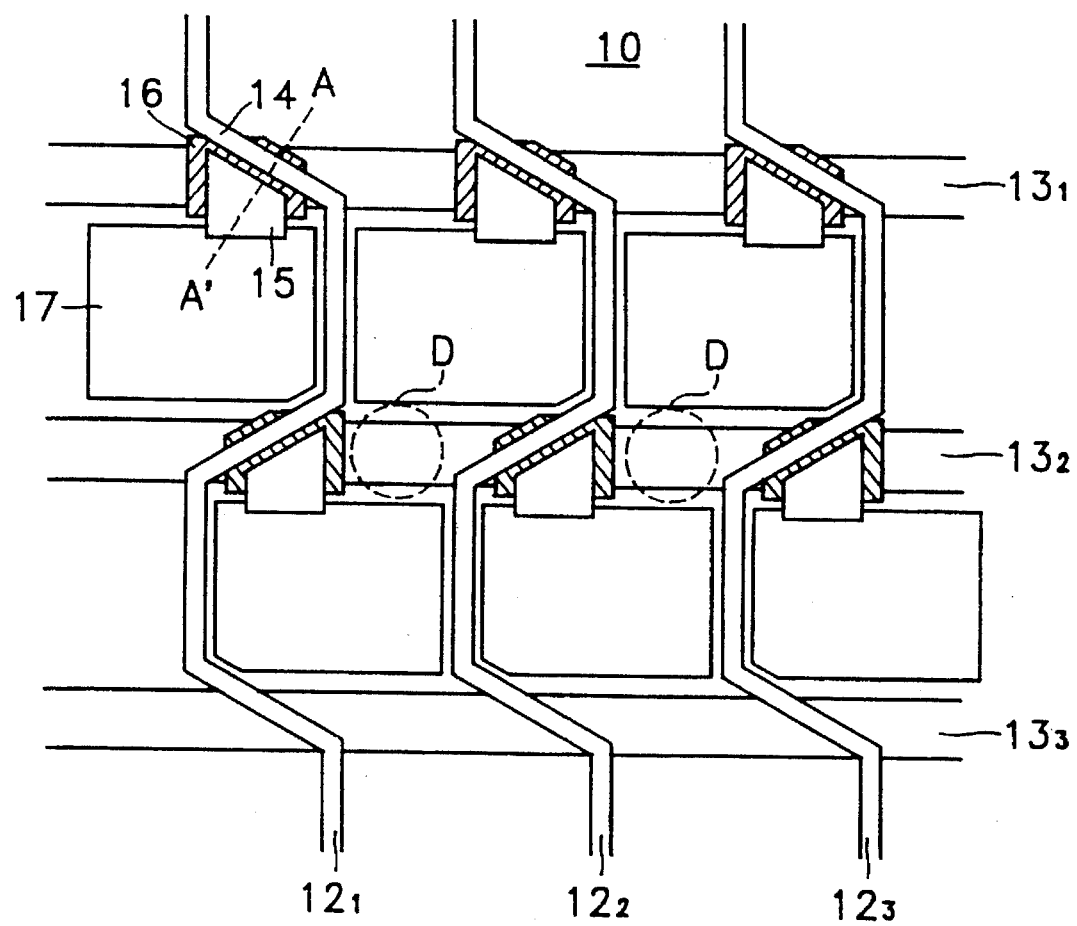
FIG. 1 is a plan view showing a part of a display panel in accordance with a first preferred embodiment of the present invention.

As shown in FIG. 1, a display panel according to the present invention includes gate lines $13_n$ and data lines $12_n$, arranged in a matrix on a glass substrate 10. The gate lines $13_n$ are arranged in parallel and data lines $12_n$ are arranged to cross the gate lines $13_n$, and the data lines $12_n$ are provided with slanted portions so as to intersect the gate lines 13 at an oblique angle. Thin film transistors are formed at each intersection of the gate lines $13_n$ and data lines $12_n$, as shown in FIG. 2B.

Referring now to FIGS. 2A and 2B showing one of the pixels of FIG. 1. A thin film transistor is formed directly on the gate line $13_1$. The data line $12_2$ crosses gate line $13_1$ at an oblique (not 90°) angle and the slanted portion of the data line forms a source electrode portion 14. The drain electrode 15 has a slanted edge 15a, and like the source electrode portion 14, is electrically connected to a pixel electrode 17. An insulating layer 11 electrically isolates the thin film transistor electrodes 14, 15 and a semiconductive layer 16 of amorphous silicon forms a channel. The insulating layer 11 and semiconductive layer 16 are formed on the gate line $13_1$, as shown in FIG. 2A.

A method for making such a display panel will now be described, referring to FIGS. 1, 2A and 2B.

First, in FIG. 2A, an aluminum layer is deposited on a transparent glass substrate 10 by sputtering, and is then patterned by photolithography to form gate lines $13_n$. The gate lines $13_n$ have a thickness of about 300 to 500 nm. Subsequently, the gate lines $13_n$ are anodized and a nitride layer forms a gate insulating layer 11 of a dual-layer structure of $Al_2O_3/Si_3N_4$. Then, an ohmic layer 19 of amorphous silicon (a-Si), and n$^+$ type amorphous silicon (N$^+$a-Si) layer 16 to which impurities are not implanted, are formed.

Next, transparent pixels electrodes 17 for each pixel are formed by indium tin oxide layers, and an aluminum layer is deposited and patterned to serially form the data lines $12_n$ and drain electrodes 15 on the resultant structure of the above process. The source electrode portion 14 is formed integrally with the data lines $12_n$, and the source electrode portion 14 is equivalent to the sloped regions of the data lines 12n that cross the gate lines. The drain electrodes 15 are spaced from the source electrode portions 14 and are connected with the pixel electrodes 17.

Since this display panel is formed by using the gate lines $13_n$ as gate electrodes, the structure is simplified and the aperture efficiency is increased. In particular, there is no need to form additional gate electrodes on the gate lines $13_n$, and it is considerably advantageous in increasing yield due to the anodization of certain parts of the gate lines $13_n$, etc.

However, because this structure reduces the channel width and deteriorates on-currents, the slanted portion of the data line $12_2$ is used as the source electrode portion 14 in such a manner that a corresponding portion of the channel width w of the thin film transistor is also slanted, as shown in FIG. 2B.

The channel width w is defined by the slanted portion of the data lines 12n, i.e. source electrode portion 14, and the slant increases the length of the channel and thus the on-currents. The width of the source electrode portion 14 may be modified according to the on-currents, embodiments, etc. The drain electrode 15 has the same profile at slanted edge 15a as the slanted source electrode portion 14.

In the pixels of liquid crystal display devices, thin film transistors form switching devices. When the transparent pixel electrodes 17 are driven, a large transparent pixel electrode can be driven easily by the increase of the on-currents due to the structure of the pixel as shown in FIG. 2B.

The increased size of the transparent indium tin oxide electrode 17 is apparent from FIG. 2B and results in increased aperture efficiency.

In a display panel formed in accordance with a second embodiment of this invention, the gate lines are provided with slanted portions at the points of intersection with the data lines, and switching devices are formed at the points of intersection. The slanted gate line portions at the points of intersections are parallel to the slanted data line portions in order to reduce areas that unnecessarily overlap each other between electrodes.

Figure 3:
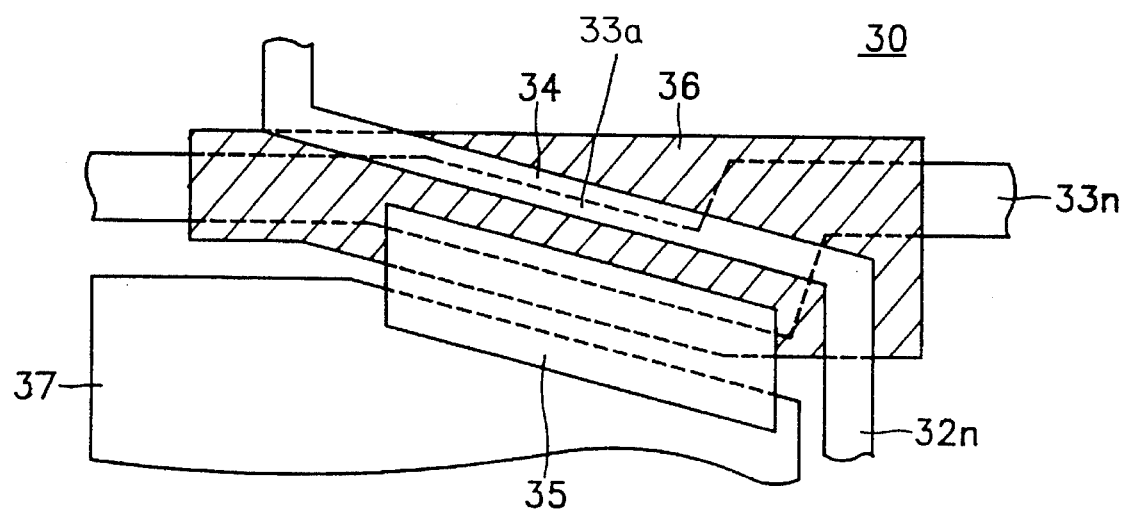
FIG. 3 is a plan view showing an enlarged portion where a switching device of a display panel is formed in accordance with a second preferred embodiment of this invention.

As shown in FIG. 3, a display panel according to the second preferred embodiment includes a gate line 33n and a data line 32n which are individual lines in a matrix formed on a glass substrate 30. The gate line 33n has a slanted portion 33a like the data lines 12n that have a slanted portion in accordance with the first preferred embodiment, and is parallel to the data line 32n in the slanted portion. A drain electrode 35 has the same profile as the slanted source electrode portion 34 of data line 32n and as the slanted portion 33a of gate line 33n.

Reference numerals 36 and 37 respectively designate a semiconductor layer and a pixel electrode. The display panel of this embodiment is formed without overlapping areas of the gate electrode, source and drain electrodes in addition to the effect of the first preferred embodiment, such that the areas overlapping between the respective electrodes are reduced considerably.

A display panel of a third embodiment of this invention has a honey-comb-shaped structure in which the basic shape of a pixel is hexagonal to provide an optimum aperture efficiency. Such pixels utilize the space efficiently and increase the efficiency of the liquid crystal process.

Figure 4:
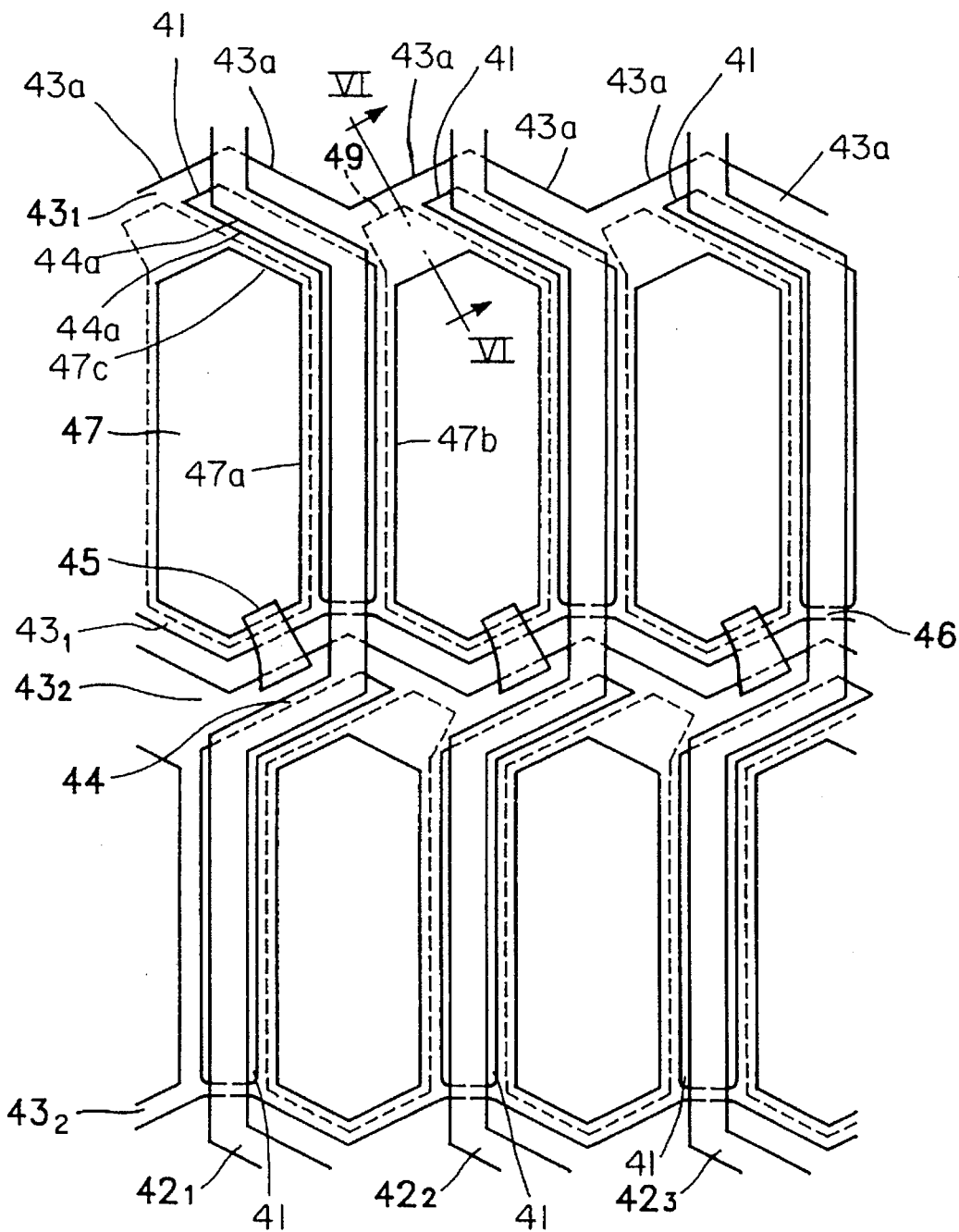
FIG. 4 is a plan view showing a part of a display panel having honey-comb-shaped pixels in accordance with this invention.
Figure 5:
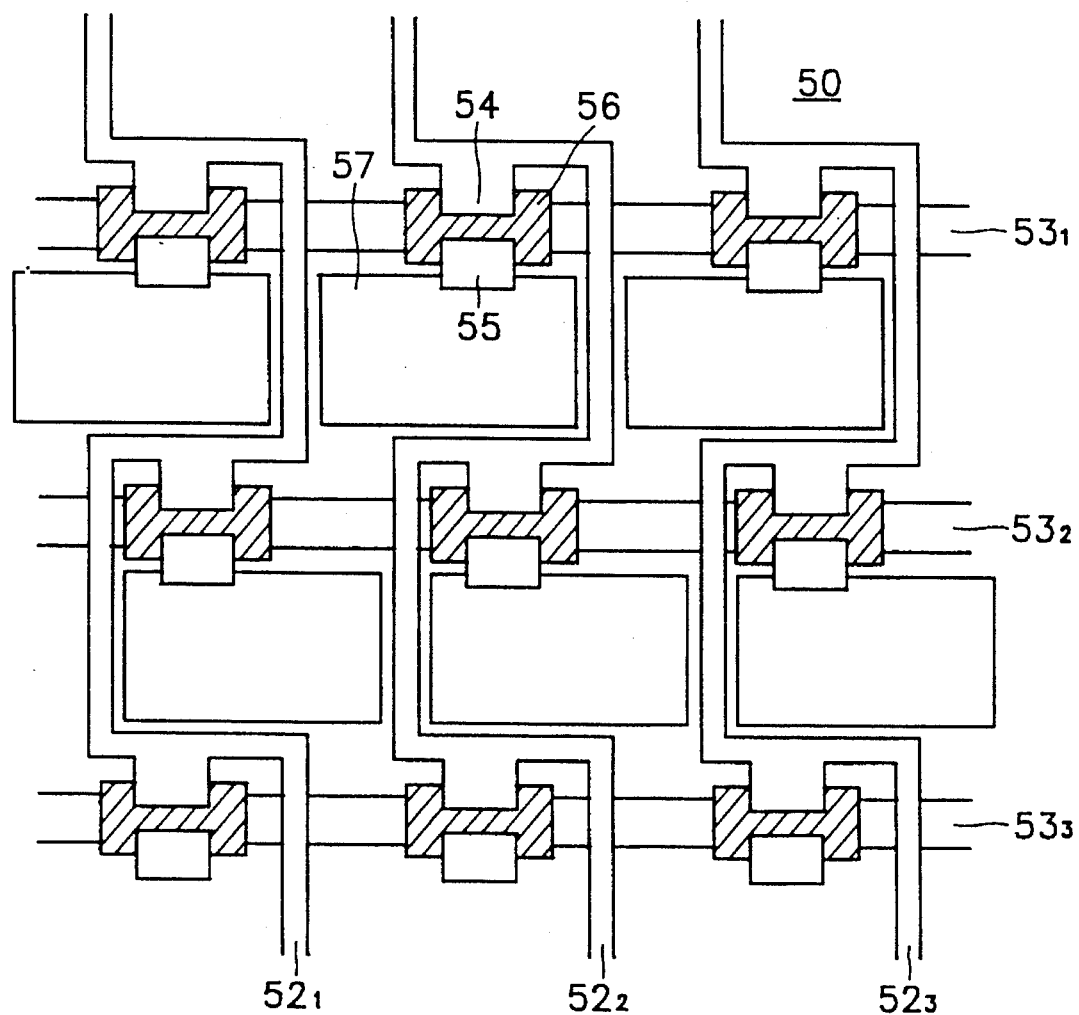

FIG. 4 is a plan view showing a part of the liquid crystal display panel including honeycomb-shaped pixels in accordance with the third preferred embodiment.

Gate lines $43_n$ are arranged in a predetermined width surrounding each pixel to use the space efficiently, and have a plurality of hexagonal edges. The upper portions 43a of adjacent hexagonal edges are connected in series, and spaces 41 where the gate lines $43_n$ are not formed are defined by the inner hexagonal edges 44a between the gate lines 43n and the spaces 41 plurality of data lines 42n cross the spaces 41 between the hexagonal edges 47a, 47b and intersect each gate line 43n. The data lines 42n are slanted to overlap a part of the gate lines at portions where the data lines 42n and gate lines 43n intersect adjacent the hexagonal edge 47c of the pixel 47, and are separated from the gate lines by an insulating layer and a semiconductor layer (not shown). Switching devices are formed on the slanted portions of the gate lines 43n adjacent to each intersection to ensure a larger channel width, as in the above-mentioned embodiment. Honeycomb-shaped pixel electrodes 47 are formed inside the above hexagonal edges to electrically connect the drain.

Figure 6:
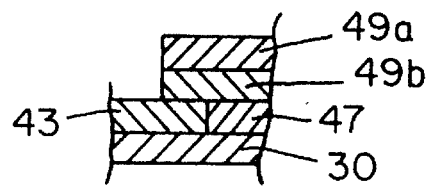
FIG. 5 is a plan view partially showing a conventional delta-shaped structure display panel and FIG. 6 is a cross-sectional view of portion VI of FIG. 4.

FIG. 6 shows a cross-sectional schematic view of portion VI of FIG. 4, wherein a transparent insulating layer 49b is formed on the pixels 47, and a capacitor electrode 49a is formed thereon.

As mentioned above, this preferred embodiment provides pixels having a hexagonal shape and signal lines crossing each pixel by a half pitch.

A capacitor or indium tin oxide electrodes 47 extending from each pixel electrode 47 together with an underlying insulating layer 49 may be disposed to overlap a predetermined portion of the gate lines 43n in order that a signal voltage input through the data lines 42n is maintained for a predetermined time until the time of the next input. The gate lines 43n of the hexagonal shape may include redundancy connecting portions 46 to be electrically connected with adjacent gate lines.

In the present embodiment providing honey comb shaped pixels, the portions "D" in FIG. 1 showing the first preferred embodiment, i.e. the gate line portions between the switching devices, may be ensured as an aperture size. The slanted portions of the data lines are used as a source electrode. Also, by reducing the radius of curvature at the corners of the pixels, the subsequent orientation processes may be easily performed.

The present embodiment does not limit the hexagonal edge-shaped gate lines to be a storage capacitor. This embodiment may be used when storage capacitors are separately formed by common lines. Also, the slanted channels increase processing margins for alignment. In accordance with the present invention as mentioned above, the aperture efficiency of the device is greatly increased, and the inclined switching devices ensure satisfactory channel width. The reduction of overlapping areas between gates, source and drain electrodes reduce the signal voltage drop by parasitic capacitance, and ease orientation of the liquid crystal element by reducing the radius of curvature at the pixel corners.

While the invention has been described in connection with what is presently considered to be the most practical and preferred embodiments, it is to be understood that the invention is not limited to the disclosed embodiments, but, on the contrary, it is intended to cover various modifications and equivalent arrangements included within the spirit and scope of the appended claims.

What is claimed is:

1. A liquid crystal display panel comprising:

a glass substrate;

a plurality of gate lines formed on said glass substrate;

an insulating layer formed over each of said plurality of gate lines;

a plurality of data lines each having slanted portions intersecting each of said plurality of gate lines at an oblique angle, each point of intersection between each of said plurality of data lines and each of said plurality of gate lines corresponding to a respective liquid crystal display cell which includes a respective thin film transistor, each of said respective thin film transistors comprising:

a gate formed from a portion of said corresponding intersecting one of said plurality of gate lines, a source electrode formed from said slanted portion of said corresponding intersecting one of said plurality of data lines, a channel region defined in a semiconductor pattern formed on said insulating layer at said intersection between said corresponding one of said plurality of gate lines and said corresponding one of said plurality of data lines, and a drain electrode formed on said semiconductor pattern, said drain electrode having a first side parallel to and spaced apart from said source electrode; and a plurality of pixel electrodes, each of said plurality of pixel electrodes being connected electrically to a corresponding drain electrode.

2. The liquid crystal display according to claim 1, wherein:

said plurality of gate lines are parallel; and said plurality of date lines are parallel.

3. A liquid crystal display panel comprising:

a glass substrate;

a plurality of gate lines formed on said glass substrate;

an insulating layer formed over each of said plurality of gate lines;

a plurality of data lines each having slanted portions intersecting each of said plurality of gate lines at an oblique angle, each point of intersection between each of said plurality of data lines and each of said plurality of gate lines corresponding to a respective liquid crystal display cell which includes a respective thin film transistor, each of said respective thin film transistors comprising:

a gate formed from a portion of said corresponding intersecting one of said plurality of gate lines, a source electrode formed from said slanted portion of said corresponding intersecting one of said plurality of data lines, a channel region defined in a semiconductor pattern formed on said insulating layer at said intersection between said corresponding one of said plurality of gate lines and said corresponding one of said plurality of data lines, and a drain electrode formed on said semiconductor pattern, said drain electrode having a first side parallel to and spaced apart from said corresponding intersecting one of said plurality of data lines, and having a second side parallel to said corresponding intersecting one of said plurality of gate lines; and a plurality of pixel electrodes, each of said plurality of pixel electrodes being connected electrically with a corresponding drain electrode.

4. A liquid crystal display panel comprising:

a glass substrate;

a plurality of gate lines formed on said glass substrate;

an insulating layer formed over each of said plurality of gate lines;

a plurality of data lines each having slanted portions intersecting each of said plurality of gate lines at an oblique angle, each point of intersection between each of said plurality of data lines and each of said plurality of gate lines corresponding to a respective liquid crystal display cell which includes a respective thin film transistor, each of said respective thin film transistors comprising:

- a gate formed from a portion of said corresponding intersecting one of said plurality of gate lines,
- a source electrode formed from said slanted portion of said corresponding intersecting one of said plurality of data lines,
- a channel region defined in a semiconductor pattern formed on said insulating layer at said intersection between said corresponding one of said plurality of gate lines and said corresponding one of said plurality of data lines, and
- a drain electrode formed on said semiconductor pattern, said drain electrode having a first side parallel to and spaced apart from said corresponding intersecting one of said plurality of data lines; and a plurality of pixel electrodes, each of said plurality of pixel electrodes being connected electrically to a corresponding drain electrode, and each of said plurality of pixel electrodes being substantially rectangular in shape.

5. A liquid crystal display panel comprising:

a glass substrate;

a plurality of gate lines formed on said glass substrate;

an insulating layer formed over each of said plurality of gate lines;

a plurality of data lines each having slanted portions intersecting each of said plurality of gate lines at an oblique angle, each point of intersection between each of said plurality of data lines and each of said plurality of gate lines corresponding to a respective liquid crystal display cell which includes a respective thin film transistor, each of said respective thin film transistors comprising:

- a gate formed from a portion of said corresponding intersecting one of said plurality of gate lines,
- a source electrode formed from said slanted portion of said corresponding intersecting one of said plurality of data lines,
- a channel region defined in a semiconductor pattern formed on said insulating layer at said intersection between said corresponding one of said plurality of gate lines and said corresponding one of said plurality of data lines, and
- a drain electrode formed on said semiconductor pattern, said drain electrode having a first side parallel to and spaced apart from said corresponding intersecting one of said plurality of data lines; and a plurality of pixel electrodes, each of said plurality of pixel electrodes being connected electrically to a corresponding drain electrode;

each of said plurality of gate lines having a slanted portion at said corresponding point of intersection between said corresponding intersecting one of said plurality of data lines and said corresponding intersecting one of said plurality of gate lines such that said corresponding intersecting ones of said plurality of data lines overlap corresponding portions of said corresponding intersecting ones of said plurality of gate lines in parallel at said corresponding points of intersection.

6. The liquid crystal display panel according to claim 5, wherein:

each of said drain electrodes have a second side parallel to said corresponding intersecting one of said plurality of gate lines.

7. The liquid crystal display panel according to claim 5, wherein:

each of said plurality of pixel electrodes are substantially rectangular in shape.

8. The liquid crystal display panel according to claim 5, wherein:

each of said plurality of pixel electrodes has a substantially hexagonal shape; and said plurality of data lines corresponding to each of said plurality of pixel electrodes are formed parallel to two hexagonal sides of each of said corresponding plurality of hexagonal shaped plurality of pixel electrodes.

9. The liquid crystal display according to claim 8, wherein:

said plurality of pixel electrodes corresponding to a plurality of rows each having a sub-plurality of said plurality of pixel electrodes, each pixel electrode in a first row being displaced by a half pitch of a corresponding pixel electrode in a neighboring second row.

10. A liquid crystal display panel comprising:

a glass substrate;

a plurality of gate lines formed on said glass substrate, each of said plurality of gate lines forming a plurality of hexagonal shaped spaces therein;

an insulating layer formed over each of said plurality of gate lines;

a plurality of data lines each having slanted portions intersecting each of said plurality of gate lines at an oblique angle, each point of intersection between each of said plurality of data lines and each of said plurality of gate lines corresponding to a respective liquid crystal display cell which includes a respective thin film transistor, each of said respective thin film transistors comprising:

- a gate formed from a portion of said corresponding intersecting one of said plurality of gate lines,
- a source electrode formed from said slanted portion of said corresponding intersecting one of said plurality of data lines,
- a channel region defined in a semiconductor pattern formed on said insulating layer at said intersection between said corresponding one of said plurality of gate lines and said corresponding one of said plurality of data lines, and
- a drain electrode formed on said semiconductor pattern, said drain electrode having a first side parallel to and spaced apart from said corresponding intersecting one of said plurality of data lines; and a plurality of pixel electrodes, each of said plurality of pixel electrodes being disposed in a corresponding hexagonal shaped space of a corresponding one of said plurality of gate lines, and each of said plurality of pixel electrodes being associated with a respective liquid crystal display cell.

11. The liquid crystal display panel according to claim 10, further comprising:

an insulating layer formed on said pixel electrodes; and a plurality of capacitor electrodes formed on said insulating layer, each of said capacitor electrodes corresponding to a respective liquid crystal display cell.

12. The liquid crystal display panel according to claim 10, wherein each of said plurality of gate lines include:

a redundancy connecting portion corresponding to a redundant electrical connection of said respective one of said plurality of gate lines between portions of said respective one of said plurality of gate lines corresponding to adjacent ones of said plurality of pixel electrodes.

13. The liquid crystal display panel according to claim 10, wherein:

each of said drain electrodes having a second side electrically connected to a respective one of said plurality of pixel electrodes, said second side of each of said drain electrodes being parallel to said corresponding intersection between said intersecting one of said plurality of data lines and said intersecting one of said plurality of gate lines.

14. The liquid crystal display panel according to claim 10, wherein:

each of said plurality of pixel electrodes has a substantially hexagonal shape.

* * * * *